US008162298B2

(12) United States Patent
Ono

(10) Patent No.: US 8,162,298 B2
(45) Date of Patent: Apr. 24, 2012

(54) METHOD FOR VAPORIZING LIQUID MATERIAL CAPABLE OF VAPORIZING LIQUID MATERIAL AT LOW TEMPERATURE AND VAPORIZER USING THE SAME

(75) Inventor: Hirofumi Ono, Shiga (JP)

(73) Assignee: Lintec Co., Ltd, Shiga (JP)

( * ) Notice: Subject to any disclaimer, the term of this patent is extended or adjusted under 35 U.S.C. 154(b) by 0 days.

(21) Appl. No.: 13/094,425

(22) Filed: Apr. 26, 2011

(65) Prior Publication Data

US 2011/0197816 A1 Aug. 18, 2011

Related U.S. Application Data

(62) Division of application No. 11/577,634, filed as application No. PCT/JP2005/017625 on Sep. 6, 2006, now Pat. No. 7,975,993.

(30) Foreign Application Priority Data

Sep. 9, 2005 (JP) .................................. 2005-262911
Oct. 14, 2005 (JP) .................................. 2005-300521

(51) Int. Cl.
*B01F 3/04* (2006.01)
(52) U.S. Cl. .................. 261/154; 261/157; 261/DIG. 65
(58) Field of Classification Search .................. 261/99, 261/104, 107, 122.1, 142, 154, 157, DIG. 65; 118/726
See application file for complete search history.

(56) References Cited

U.S. PATENT DOCUMENTS

| 5,536,323 | A | * | 7/1996 | Kirlin et al. | .................. | 118/726 |
| 5,693,267 | A | | 12/1997 | Beshore et al. | | |
| 5,711,816 | A | * | 1/1998 | Kirlin et al. | .................. | 118/726 |
| 5,882,416 | A | * | 3/1999 | Van Buskirk et al. | ........ | 118/726 |
| 6,169,852 | B1 | | 1/2001 | Liao et al. | | |
| 6,210,485 | B1 | * | 4/2001 | Zhao et al. | ..................... | 118/724 |
| 6,349,887 | B1 | * | 2/2002 | Pyo | ............................... | 239/137 |
| 6,962,624 | B2 | | 11/2005 | Jurgensen et al. | | |
| 7,827,932 | B2 | * | 11/2010 | Kojima et al. | .......... | 118/723 VE |
| 7,975,993 | B2 | * | 7/2011 | Ono | ............................. | 261/154 |
| 2003/0192471 | A1 | | 10/2003 | Jurgensen et al. | | |
| 2003/0209201 | A1 | * | 11/2003 | Takamatsu et al. | ........... | 118/726 |
| 2007/0101940 | A1 | | 5/2007 | Iizuka | | |

FOREIGN PATENT DOCUMENTS

| EP | 1 548 813 | 6/2005 |
| JP | 63-19569 | 2/1988 |
| JP | 6-349747 | 12/1994 |
| JP | 10008255 | 1/1998 |
| JP | 10074746 | 3/1998 |
| JP | 11061411 | 3/1999 |
| JP | 2001-011634 | 1/2001 |
| JP | 2005-57193 | 3/2005 |

* cited by examiner

*Primary Examiner* — Charles Bushey
(74) *Attorney, Agent, or Firm* — Lucas & Mercanti, LLP

(57) ABSTRACT

A vaporizer is provided with a vaporizing chamber heated by heaters; a primary filter positioned in a bottom end portion of the vaporizing chamber and heated by the heater; a liquid material supply portion for dropping down a flow-controlled liquid material from upper portion of the vaporizing chamber toward the primary filter; a carrier gas guiding passage for guiding a carrier gas into the underside of the primary filter; and a material delivering passage for discharging a mixed gas including the carrier gas and a vaporized liquid material from the top of the vaporizing chamber. The liquid material dropped down onto the primary filter is partially vaporized, while the rest thereof is atomized by being subjected to bubbling effect provided by the carrier gas flowing from underneath.

1 Claim, 10 Drawing Sheets

METHOD FOR VAPORIZING LIQUID MATERIAL CAPABLE OF VAPORIZING LIQUID MATERIAL AT LOW TEMPERATURE AND VAPORIZER USING THE SAME

This is a Divisional Application of U.S. patent application Ser. No. 11/577,634 filed Apr. 20, 2007, now U.S. Pat. No. 7975993, issued Jul. 12, 2011, which was a 371 of PCT/JP05/17625 filed Sep. 6, 2006, which claimed the priority of Japanese Patent Application 2005-262911 filed Sep. 9, 2005, and Japanese Patent Application 2005-300521 filed Oct. 14, 2005, each of these applications are incorporated herein by reference.

BACKGROUND OF THE INVENTION

1. Field of the Invention

The present invention relates to a vaporizer capable of efficiently vaporizing a liquid material for thin film production supplied to a CVD apparatus, at low temperature.

2. Description of the Related Art

In a process of producing a semiconductor device, chemical vapor deposition apparatus (CVD apparatus) deposit variety of thin films on a wafer.

In recent years, in the CVD apparatus, liquid compounds, such as liquid organic compounds and organic metal solutions, have been used as a liquid material for thin film production. A vaporizer for the liquid material is indispensably preceded by the CVD apparatus, because it is necessary to supply a vaporized liquid material to the CVD apparatus to deposit the thin film on the water in the CVD apparatus.

Typical means for vaporizing the liquid material includes a method of vaporizing the liquid material in the vaporizer with heat supplied by a heater or the like; see Japanese Patent Laid-Open No. 2002-105646.

SUMMARY OF THE INVENTION

Although many vaporizers for vaporizing the liquid material have been developed and used, these vaporizers have the following problems.

Recently, to increase a deposition rate in the CVD apparatus using a compound with low vapor pressure and low thermal stability as the liquid material, the vaporizer which is capable of vaporizing a large amount of the liquid material is required. In order to improve vaporization performance of the vaporizer, it is necessary to increase a temperature of vaporization. However, if the temperature of vaporization is excessively increased, the liquid material would be not only vaporized but also chemically modified due to the liquid material itself being thermally decomposed. Thus it results in the problem that thermal decomposition products and polymers, accumulate in the vaporizer, blocking passages for the liquid material, for example.

The present invention is intended to provide the vaporizer capable of decreasing the temperature of vaporization owing to high vaporization efficiency thereof, preventing accumulation of thermal decomposition products and polymers in the vaporizer and blocking of the passages even for the liquid material with high thermal decomposability, and vaporizing a large amount of the liquid material.

In accordance with a first aspect of the present invention, a method of vaporizing a liquid material (LM) comprising the steps of: guiding a carrier gas (CG) into an underside of a primary filter (80) positioned in a bottom end portion of a vaporizing chamber (60) heated by heaters (66), (76), and (81); dropping or flowing the flow-controlled liquid material (LM) down toward the primary filter (80); vaporizing the liquid material (LM) at a surface of the primary filter (80) with heat from the heaters (66), (76), and (81), while atomizing the liquid material (LM) by mixing with the carrier gas (CG); and discharging the vaporized and atomized liquid material (MM) with the carrier gas (CG) from the top of the vaporizing chamber (60).

According to this aspect, the liquid material (LM) dropped down onto the primary filter (80) forms a liquid film on a surface of the primary filter (80), and is partially vaporized by receiving the heat from the primary filter (80) while the rest being atomized by being subjected to bubbling effect provided by the carrier gas (CG) flowing from underneath. The liquid material (LM), a portion of which has been vaporized and the rest has been atomized, is conveyed by the carrier gas (CG) to move upward within the vaporizing chamber (60), and in the meanwhile mist (MM) is vaporized by receiving the heat. Here, since the liquid material (LM) has been atomized and thus it provides significantly larger surface area receiving the heat as compared with that which has not been atomized, the liquid material (LM) can efficiently receive the heat. A mixed gas (VM CG) including the vaporized liquid material (VM) and the carrier gas (CG) is then discharged from the top of the vaporizing chamber (60).

In accordance with a second aspect of the present invention, a vaporizer (10) comprising: the vaporizing chamber (60) heated by the heaters (66), (76), and (81); a primary filter (80) positioned in the bottom end portion of the vaporizing chamber (60) and heated by any of the heater (66), (76), and (81); a liquid material supply portion (24) for dropping down the flow-controlled liquid material (LM) from upper portion of the vaporizing chamber (60) toward the primary filter (80); a carrier gas guiding passage (78) for guiding the carrier gas (CG) into the underside of the primary filter (80); and a material delivering passage (62) for discharging the mixed gas (VM+CG) including the carrier gas (CG) and the vaporized liquid material (VM) from the top of the vaporizing chamber (60).

This aspect is related to the vaporizer (10) for performing the first aspect of the present invention, an object achieved by the vaporizer (10) is equivalent to that achieved by the first aspect of the present invention.

In accordance with a third aspect of the present invention is the vaporizer (10) of the second aspect, further comprising a secondary filter (64) positioned in an upper end portion of the vaporizing chamber (60) and heated by the heater (66), wherein the mixed gas (VM+CG) including the carrier gas (CG) and the vaporized liquid material (VM) having passed through the secondary filter (64) is discharged from the top of the vaporizing chamber (60) through the material delivering passage (62).

Although the liquid material (LM), a portion of which has been vaporized and the rest has been atomized at the primary filter (80), is conveyed by the carrier gas (CG) to move upward within the vaporizing chamber (60), and in the meanwhile the mist (MM) is vaporized by receiving the heat, the liquid material (LM) may not be completely vaporized, leaving a small amount of the mist (MM) in the mixed gas (VM+CG). However, according to this invention, the mixed gas (VM+CG) containing the mist (MM) is completely vaporized upon passing through the secondary filter (64) by the mist (MM) being collected by the secondary filter (64) and the collected mist (MM) receiving the heat from the secondary filter (64).

In accordance with a forth aspect of the present invention, the vaporizer (10) of the second or the third aspect, wherein the liquid material supply portion (24) and the vaporizing chamber (60) are isolated from each other, and a connecting tube for heat isolation (94) is arranged therebetween.

According to this aspect, isolating the liquid material supply portion (24) and the vaporizing chamber (60) from each other causes the heat from the vaporizing chamber (60), which reaches a high temperature, less likely to be transmitted to the liquid material supply portion (24).

In accordance with a fifth aspect of the present invention, the vaporizer (10) of any one of the second to the forth aspect, wherein a preheating filter (102) heated by the heater (81) for the carrier gas (CG) is provided in the carrier gas guiding passage (78).

According to this aspect, the carrier gas (CG) before being guided into the primary filter (80) passes through the heated preheating filter (102). Accordingly, the temperature of the carrier gas (CG) can be regulated as desired.

In accordance with a sixth aspect of the present invention, The vaporizer (10) comprising: the vaporizing chamber (60) heated by the heaters (66), (76), and (81); the primary filter (80) positioned in the bottom end portion of the vaporizing chamber (60) and heated by the heater (81); the liquid material supply portion (24) for supplying the flow-controlled liquid material (LM) from upper portion of the vaporizing chamber (60) through a capillary (112) to the vicinity of the surface of the primary filter (80); the carrier gas guiding passage (78) for guiding the carrier gas (CG) into the underside of the primary filter (80); and the material delivering passage (62) for discharging the mixed gas (VM+CG) including the carrier gas (CG) and the vaporized liquid material (VM) from the vaporizing chamber (60).

According to this aspect, the liquid material (LM) supplied from the liquid material supply portion (24) passes through the inside of the capillary (112) to be fed to the vicinity of the surface of the primary filter (80), so that the liquid material (LM) is not affected by convection or turbulence of flowing air generated within the vaporizing chamber (60).

According to the first and the second aspect, the liquid material (LM) can be vaporized and atomized at the primary filter (80), while the mist (MM) can be further vaporized in the vaporizing chamber (60). Accordingly, the vaporizer (10) can offer higher vaporization efficiency as compared with a conventional vaporizer which only applies the heat for vaporizing the liquid material (LM). Moreover, the high vaporization efficiency enables vaporizing the liquid material (LM) even at low temperature, so that it can prevent accumulation of thermal decomposition products and polymers in the vaporizer (10) and blocking of passages even for the liquid material with high thermal decomposability, and can vaporize a large amount of the liquid material.

According to the third aspect, the liquid material (LM) can be vaporized and atomized at the primary filter (80), while the unvaporized mist (MM), remaining in the mixed gas (VM+CG), can be collected and vaporized at the secondary filter (64). Thereby, the vaporizer (10) with the high vaporization efficiency can be provided.

According to the forth aspect, the heat from the vaporizing chamber (60), which reaches a high temperature, becomes less transmissible to the liquid material supply portion (24), so that it can avoid the problem in regard to polymerization or decomposition of thermally unstable compounds due to the liquid material supply portion (24) being undesirably heated to a high temperature.

According to the fifth aspect, the carrier gas (CG) can be heated before being guided to the primary filter (80). Accordingly, the heat from the heater (81) provided to the primary filter (80) can be used not for heating the carrier gas (CG) but for only vaporizing the liquid material (LM), so that the vaporization efficiency of the vaporizer (10) is not reduced even when the carrier gas (CG) at low temperature is used.

According to the six aspect, the liquid material (LM) fed to the primary filter (80) is not affected by a variation in the flowing air within the vaporizing chamber (60). Accordingly, change in a thickness of a liquid film (114) formed on the surface of the primary filter (80) can be decreased, and thus a vaporizer (110) can offer stable vaporization performance.

Figure 1:
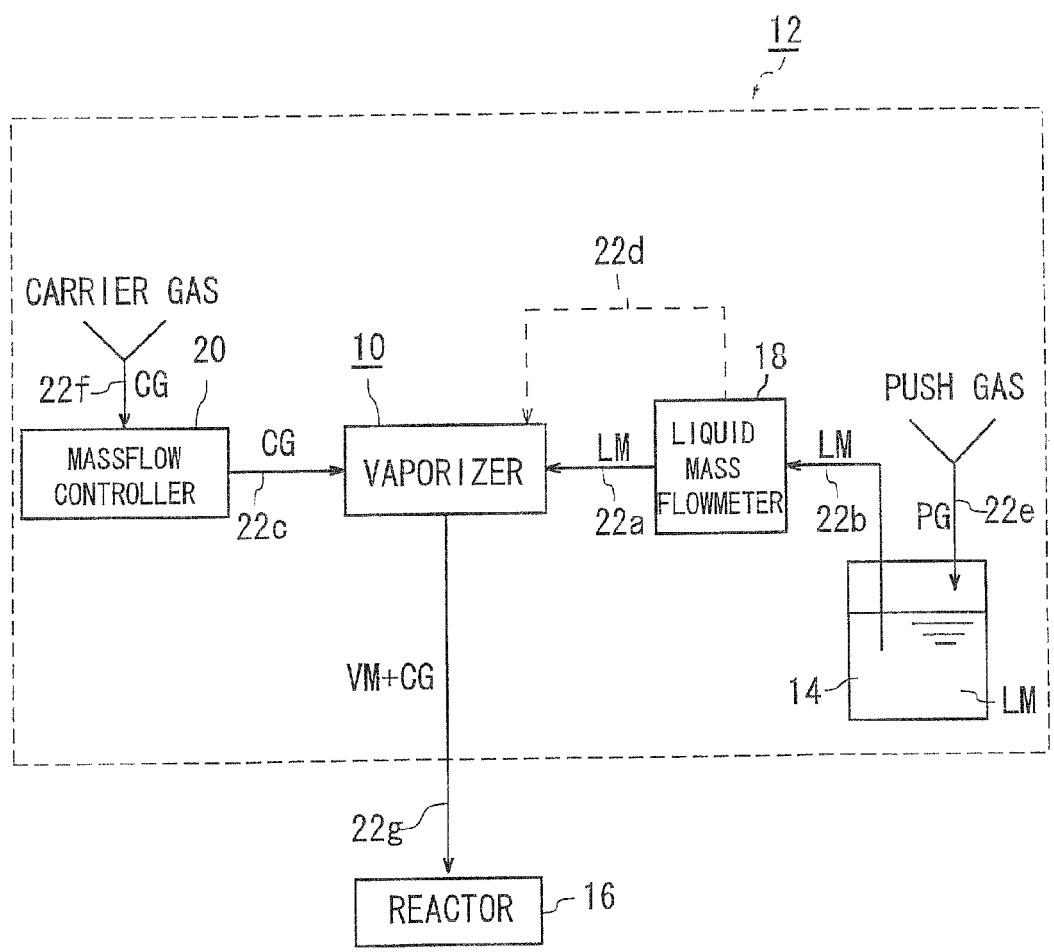
FIG. 1 shows a block diagram of a liquid material supplying apparatus.

Description Of Symbols
10 vaporizer
24 liquid material supply portion
26 vaporizing portion
60 vaporizing chamber
62 material delivering passage
64 secondary filter
66 upper block heater
76 middle block heater
78 carrier gas guiding passage
80 primary filter
81 lower block heater

DETAILED DESCRIPTION OF THE INVENTION

Hereinafter, a vaporizer (10) adopting the present invention will be described in detail with reference to the figures.

First Embodiment

FIG. 1 shows an example of a vaporized liquid material supplying apparatus (12) having the vaporizer (10) according to the present invention incorporated therein. In this regard, the vaporized liquid material supplying apparatus (12) is for vaporizing a liquid material (LM) supplied from a material tank (14) to provide a vaporized material (VM). And the vaporized liquid material supplying apparatus (12) is for conveying the vaporized material (VM) by a carrier gas (CG) to supply it to a reactor (16), such as a CVD apparatus. In addition, the vaporized liquid material supplying apparatus (12) includes the vaporizer (10), the material tank (14), a liquid mass flowmeter (18), and a massflow controller (20), or the like, which are connected to each other via liquid material supply tubes (22a), (22b), and a carrier gas supply tube (22c). The vaporizer (10) and the liquid mass flowmeter (18) are connected to each other via a control line (22d).

Figure 2:
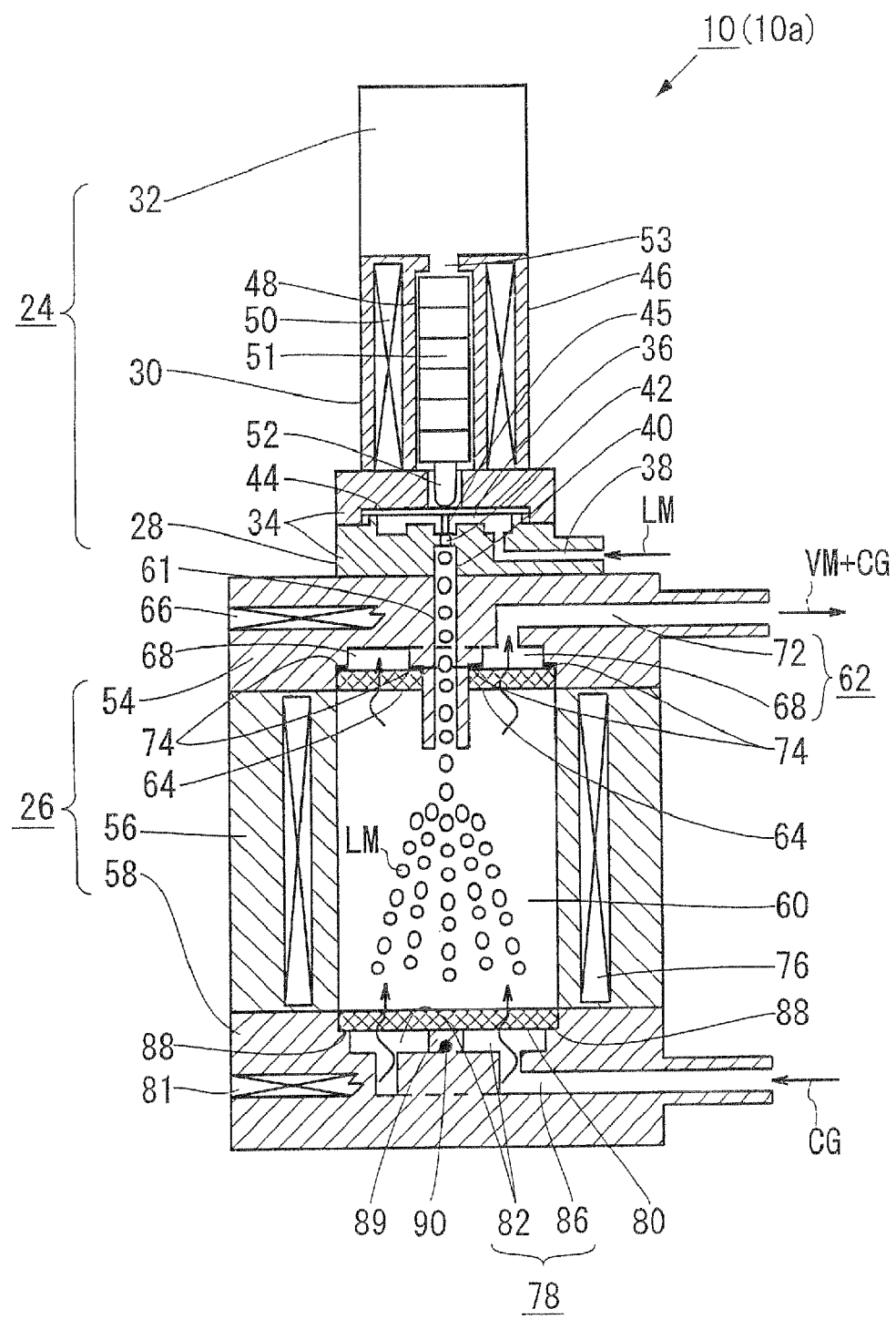
FIG. 2 shows a sectional view of a vaporizer according to a first embodiment.

A vaporizer (10a) adopting the present invention generally includes a liquid material supply portion (24) and a vaporizing portion (26), as shown in FIG. 2.

The liquid material supply portion (24) includes a flow control valve (28), an actuator (30), and a pneumatic shutoff valve (32).

The flow control valve (28) has a housing (34). And a valve chest (36) is formed in the housing (34) with the upper end of the valve chest (36) being open toward a top surface of the housing (34). In the interior of the housing (34), a liquid material guiding passage (38) and a liquid material guiding orifice (40) are provided. The liquid material guiding passage (38) is for guiding the liquid material (LM) into the bottom of the valve chest (36). The upper end of the liquid material guiding orifice (40) is connected to the bottom of the valve chest (36). The liquid material guiding orifice (40) includes a material guiding port (42) as an opening to the valve chest (36). In the interior of the valve chest (36), there is a diaphragm (44) made of an elastic material attached thereto. And a central portion of the diaphragm (44) being provided with a valve body (45) fitted in the material guiding port (42) for changing an amount of the liquid material (LM) to be supplied to the vaporizing chamber (60) by changing the opening of the material guiding port (42).

The actuator (30) has a tubular housing (46) set up on a top surface of the flow control valve (28). And a cylinder (48) is provided therein. A coil (50) is positioned on the outside of the cylinder (48). A driver element (51) is contained in the cylinder (48) so as to be slidable in the vertical direction. On the upper end of the cylinder (48), an orifice (53) is provided therein. On the bottom end of the driver element (51), a plunger (52) is attached thereto for controlling the opening of the material guiding port (42) by adjusting a depressing amount of the diaphragm (44).

The driver element (51) changes a position thereof in the cylinder (48) depending on voltage applied to the coil (50). Although a solenoid element is used as such the driver element (51) in this embodiment, it is not limited thereto and a piezoelectric element can also be used, for example.

The material guiding port (42) is blocked off when the driver element (51) is placed at the lowest end in the cylinder (48). And the material guiding port (42) is opened when the voltage is applied to the coil (50) to raise the driver element (51). Since the driver element (51) moves very fast depending on the applied voltage for the coil (50), it can instantly move to the position corresponding to the voltage applied to the coil (50) even when the voltage for the coil (50) has been set up to be applied at a minute form of time interval.

The pneumatic shutoff valve (32) is a device for completely cutting off the liquid material (LM) flowing into the material guiding port (42). Supply of the liquid material (LM) is suspended for every processing batch of a wafer and the interior of the vaporizer (10) is maintained. The pneumatic shutoff valve (32) is arranged on the top surface of the actuator (30). By applying pneumatic pressure from a bottom surface of the pneumatic shutoff valve (32) toward the cylinder (48) via the orifice (53), a central portion of the diaphragm (44) bends downward, completely shutting off the material guiding port (42). Thereby, the liquid material (LM) flowing into the material guiding port (42) can be completely shut off. Such the pneumatic shutoff valve (32) is provided because the flow control valve (28), which is normally used when operating the vaporizer (10), is intended to precisely control a flow rate of the liquid material (LM) and thus not suitable for cutting off the flow of the liquid material (LM).

The vaporization unit (26) is arranged below the liquid material supply unit (24).

The vaporizing portion (26) is for heating and vaporizing the liquid material (LM). The vaporizing portion (26) includes an upper block (54), a middle block (56), and a lower block (58). These blocks (54), (56), and (58) cooperate with each other to form a vaporizing chamber (60) therein.

The upper block (54) is a metal column as a lid of the vaporizing chamber (60). The upper block (54) includes a liquid material supply orifice (61) drilled in the center thereof. The upper block (54) includes a material delivering passage (62). A secondary filter (64) fitted into the upper block (54). And an upper block heater (66) is embedded in the upper block (54).

The material delivering passage (62) is for delivering the vaporized liquid material (VM) out of the vaporizer (10) with the carrier gas (CG) to supply it to the CVD apparatus. The material delivering passage (62) includes a recess (68) formed in a ring concentric with the liquid material supply orifice (61) and a passage (72) drilled therein so that a top surface of the recess (68) and a side surface of the upper block (54) are connected each other. Moreover, a step is provided on the side of the recess (68), wherein a bottom end portion of the recess (68) is formed wider than the upper section of the recess (68). Thereby, a joint portion (74) is formed where a surface of the secondary filter (64) is on an inner surface of the recess (68) when the secondary filter (64) is fitted in the recess (68).

The secondary filter (64) collects mist (MM). And the secondary filter (64) transmits heat from the upper block heater (66) to the mist (MM) for vaporization. The secondary filter (64) is a ring-shaped metal material fitted in the bottom end portion of the recess (68) of the material delivering passage (62). And the secondary filter (64) includes an orifice for avoiding interference with the liquid material supply orifice (61) drilled in the central portion. Since the secondary filter (64) includes a metal material with a high heat transfer coefficient and is on the joint portions (74) to be fitted in the recess (68), the heat from the upper block heater (66) can be efficiently transmitted to the mist (MM). In this regard, a metal filter is used in this embodiment.

The middle block (56) is a cylinder constituting the side wall of the vaporizing chamber (60), having an outer diameter equal to that of the upper block (54) and including a middle block heater (76) embedded therein. An inner diameter of the middle block (56) is formed to be substantially equal to the outer diameter of the secondary filter (64). The inner diameter of the middle block (56) is not necessarily equal to the outer diameters of the secondary filter (64). And the outer diameter of the middle block (56) is also not necessarily equal to the upper block (54). The middle block (56) is provided for adapting to the case where the volume of the vaporizing chamber (60) is desired to be changed by replacing only the middle block (56) with that having desired inner and outer diameters.

The lower block (58) is a metal column as a bottom of the vaporizing chamber (60). The lower block (58) includes a carrier gas guiding passage (78), a primary filter (80) fitted into the lower block (58). And a lower block heater (81) is embedded in the lower block (58).

Figure 3:
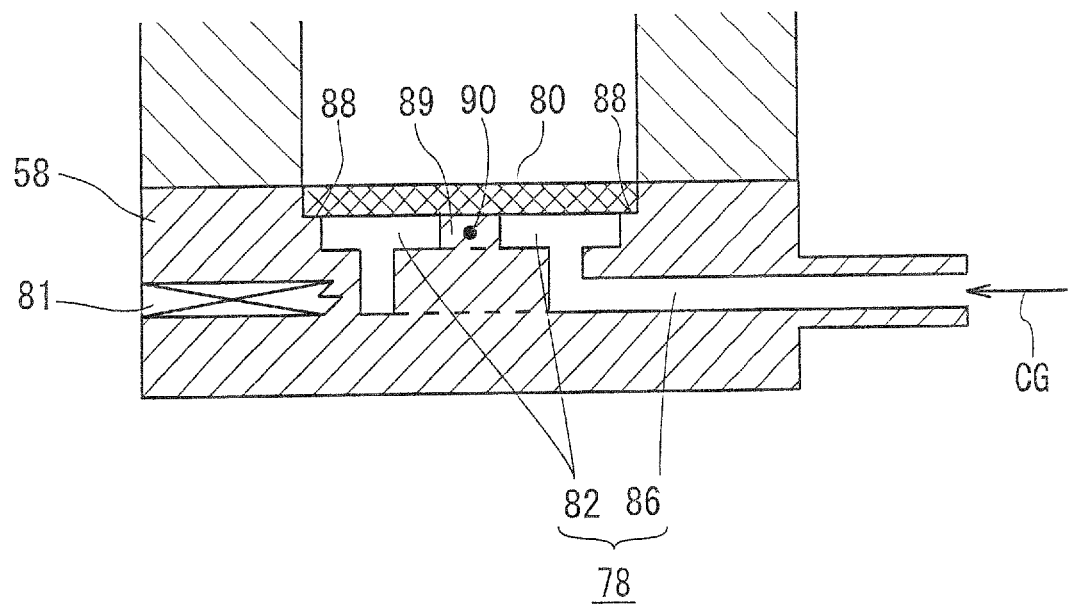
FIG. 3 shows an enlarged sectional view of a lower block and a primary filter section of the vaporizer of FIG. 2.

The carrier gas guiding passage (78) is for guiding the carrier gas (CG), which guides the vaporized liquid material (VM) to the CVD apparatus, into the vaporizing chamber (60), constituted by a recess (82) formed in a ring concentric with the central axis of the liquid material supply orifice (61) and a passage (86) drilled therein so that a bottom surface of the recess (82) and a side surface of the lower block (58) are connected with each other. Moreover, a step is provided on the side of the recess (82), wherein an upper end portion of the recess (82) is formed wider than the lower section of the recess (82). Thereby, a joint (88) is formed where a surface of the primary filter (80) is on an inner surface of the recess (82) when the primary filter (80) is fitted in the recess (82). The recess (82) has a projection (89) formed on the central portion. The projection (89) is on the primary filter (80). And the projection (89) includes a thermocouple (90) embedded therein for temperature measurement (see FIG. 3).

The primary filter (80) is a disk-shaped porous metal fitted in the upper end portion of the recess (82) of the carrier gas guiding passage (78). The primary filter (80) receives the liquid material (LM) dropped thereon at a top surface and transmits the heat from the lower block heater (81) to the liquid material (LM). Since the primary filter (80) includes a material with a high heat transfer coefficient and is on the joint portions (88), the heat from the lower block heater (81) can be efficiently transmitted to the liquid material (LM). In this embodiment, a sintered filter made of a sintered metal powder is preferably used for the primary filter (80).

The heaters (66), (76), and (81), are each connected with a thermoregulator, so that the temperature of the interior of the vaporizing chamber (60) can be independently regulated to regulate as desired. The number of the heaters is set up appropriately if needed, and a plurality of heaters may be controlled to be common.

The configuration of the vaporized liquid material supplying apparatus (12), which has been briefly described first, is described in detail with reference to FIGS. 1 and 2. The liquid material guiding passage (38) of the vaporizer (10) is connected with the liquid mass flowmeter (18) via the liquid material supply tube (22*a*). The liquid mass flowmeter (18) is connected with the material tank (14) via the liquid material supply tube (22*b*). And the material tank (14) is connected with a push gas guiding tube (22*e*) for guiding a push gas (PG).

In addition, the carrier gas guiding passage (78) of the vaporizer (10) is connected with the massflow controller (20) via the carrier gas supply tube (22*c*). And the massflow controller (20) is connected with a carrier gas supply tube (22*f*) for supplying the carrier gas (CG).

Moreover, the actuator (30) of the vaporizer (10) is connected with the liquid mass flowmeter (18) via the control line (22*d*), and the material delivering passage (62) is connected with the reactor (16) via a material supply tube (22*g*) for supplying a mixed gas (VM+CG) including the vaporized liquid material (VM) and the carrier gas (CC).

The material tank (14) stores the liquid material (LM), such as liquid organic metal used as the material of a thin film. The liquid mass flowmeter (18) measures a mass flow rate of the liquid material (LM) flowing through the liquid material supply tube (22*b*) (mass of the liquid material which flows per unit time). And the liquid mass flowmeter (18) applies the voltage to the coil (50) of the actuator (30) based on the mass flow rate. The massflow controller (20) regulates an amount of the carrier gas (CG) supplied to the vaporizer (10). The reactor (16) is "a film deposition means" for forming the thin film on the wafer by letting the supplied vaporized material (VM) react with other gas (or by decomposing the vaporized material (VM)) using thermal energy, plasma energy, or the like. In the liquid mass flowmeter (18), the voltage is applied to the coil (50) in accordance with the mass flow rate of the liquid material (LM) flowing therethrough, thereby the opening of the material guiding port (42) is adjusted so that the mass of the liquid material (LM) fed to the vaporizer (60) is equalized.

A method of vaporizing the liquid material (LM) using the liquid vaporization supplying apparatus (12) is described as follows.

Supplying the push gas (PG) to the material tank (14), the pressure in the material tank (14) increases. Thus a liquid level of the liquid material (LM) is depressed. Inert gas, e.g., helium or the like, is preferably used as the push gas (PG). When the liquid level of the liquid material (LM) is depressed, the liquid material (LM) flows through the liquid material supply tube (22*b*), and is fed to the valve chest (36) of the vaporizer (10) through the liquid mass flowmeter (18). At this time, the liquid mass flowmeter (18) measures the mass flow rate of the liquid material (LM) flowing therethrough, and the voltage is applied to the coil (50) of the vaporizer (10) based on a measured flow rate signal. Thereby, the opening of the material guiding port (42) is adjusted, resulting in the liquid material (LM) at the constant mass flow rate being continuously dropped from the bottom end of the liquid material supply orifice (61) into the vaporizing chamber (60).

Figure 4:
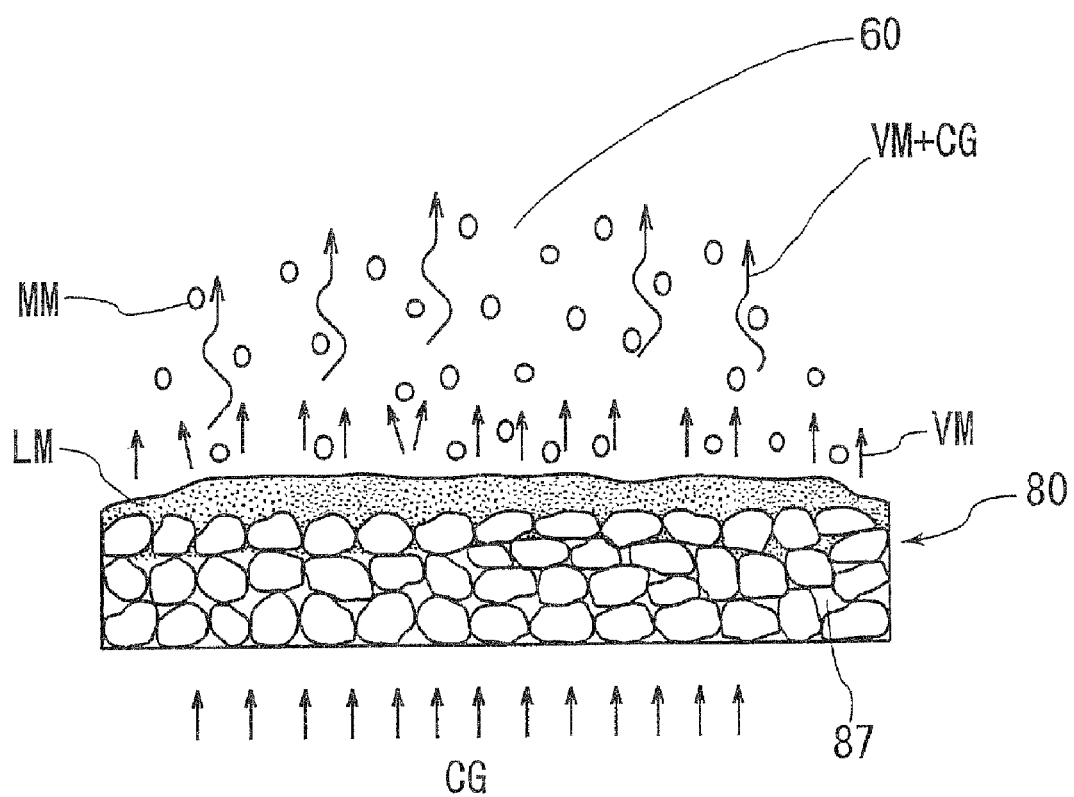
FIG. 4 shows a schematic view of a change in property of a liquid material on a surface of the primary filter.

The liquid material (LM) continuously dropped into the vaporizing chamber (60) falls the interior of the vaporizing chamber (60) with gravity, and reaches to the surface of the primary filter (80) arranged on the bottom surface of the vaporizing chamber (60). Since the primary filter (80) is made of the sintered metal powder, a number of microspaces (87) are formed in the primary filter (80) as shown in FIG. 4. Accordingly, the liquid material (LM) reached to the surface of the primary filter (80) forms the liquid film on the surface of the primary filter (80) while penetrating into the microspaces (87) by capillary action. Then, a portion of the liquid material (LM), which has received the heat from the lower block heater (81) via the primary filter (80), is vaporized.

Meanwhile, when the carrier gas (CG) is supplied to the massflow controller (20), the mass flow rate of the carrier gas (CG) is controlled so that the carrier gas (CG) at a given mass flow rate is continuously fed to the carrier gas guiding passage (78) of the vaporizer (10) through the carrier gas supply tube (22*c*). The inert gas, e.g., helium or nitrogen, is preferably used as the carrier gas (CG).

The carrier gas (CG) fed to the carrier gas guiding passage (78) flows upward from the underside of the primary filter (80) through the microspaces (87) into the vaporizing chamber (60). Then the liquid material (LM), which has formed the liquid film and penetrated into the microspaces (87) forms the fine mist (MM) (drops in the mist form) with bubbling effect.

Figure 5:
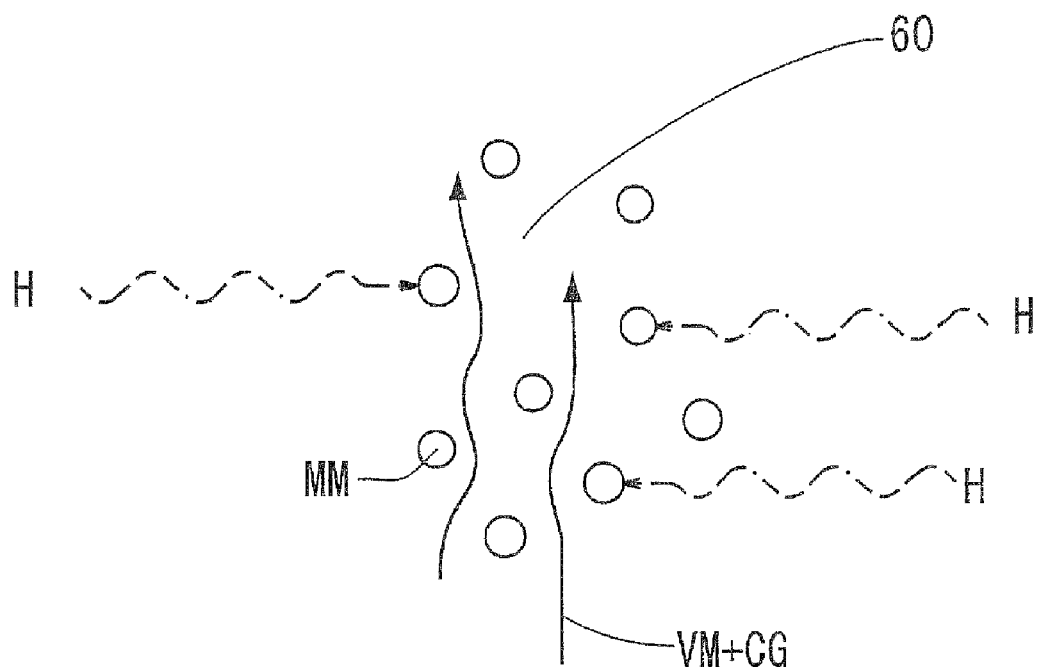
FIG. 5 shows a schematic view of a state that the liquid material in the mist form moving upward in a vaporizing chamber receives radiant heat from a wall.

The liquid material (LM), vaporized at the primary filter (80) and formed into the mist (MM), is conveyed by the carrier gas (CG) to move toward the secondary filter (64) while floating within the vaporizing chamber (60). While moving, the mist (MM) is vaporized by receiving radiant heat (H) from the wall of the vaporizing chamber (60) heated by the heaters (66), (76), and (81) (see FIG. 5).

The liquid material (LM) conveyed by the carrier gas (CG) moves upward within the vaporizing chamber (60) while being vaporized, and passes through the secondary filter (64) to be guided into the material delivering passage (62) provided in the upper block (54). Then the mist (MM) which has not been vaporized is collected by the secondary filter (64). The mist (MM) then receives the heat from the upper block heater (66) via the secondary filter (64), thereby it is completely vaporized.

The liquid material (LM) which has been completely vaporized by passing through the secondary filter (64) is discharged from the vaporizer (10) through the material delivering passage (62) with the carrier gas (CG) to be fed to the reactor (16) via the material supply tube (22g).

As described above, by using the vaporizer (10) of the present invention, it can efficiently vaporize the liquid material (LM) without increasing the temperature of the whole vaporizing chamber (60) as compared with the conventional vaporizer which vaporizes the liquid material (LM) by simply increasing the temperature in the vaporizing chamber (60), and can prevent the liquid material (LM) itself from being thermally decomposed. Consequently, problems that decomposed components of the liquid material (LM) accumulate within the vaporizing chamber (60) or block the material delivering passage (62) are avoided.

The primary filter (80) and the secondary filter (64) may be used the metal filters or sintered filters, as well as those made of a metal alloy, metal fibers, woven metallic wires, or a metal mesh, as appropriate, as long as the material allows the carrier gas (CG) or the vaporized liquid material (VM) to pass therethrough. In addition, apertures of the filters (64) and (80) are also not limited to those of this embodiment, and the filters with the apertures suitable for use conditions can be used. However, since the secondary filter (64) serves to collect the mist (MM), the apertures of the secondary filter (64) are preferably smaller than those of the primary filter (80).

Second Embodiment

Figure 6:
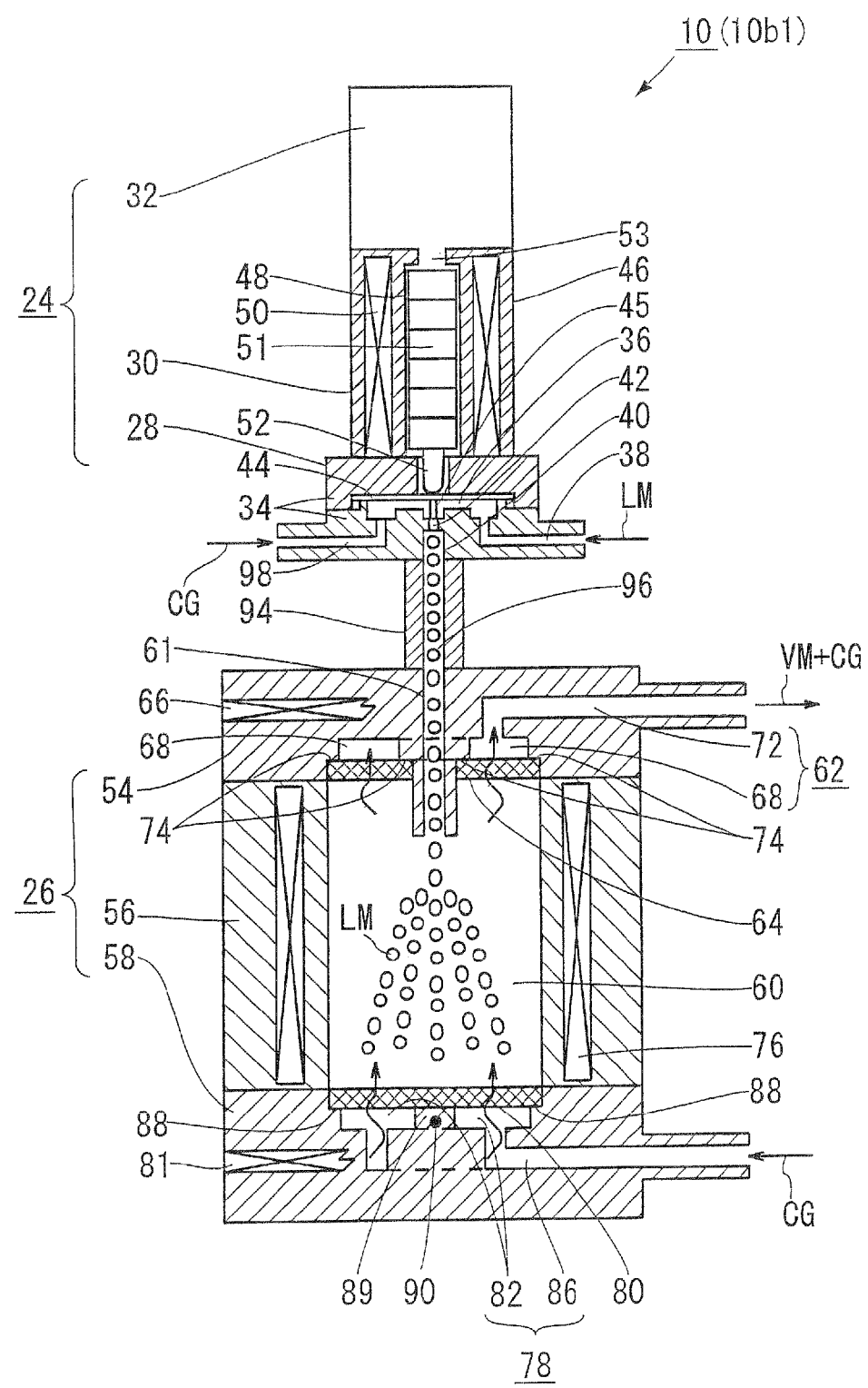
FIG. 6 shows a sectional view of the vaporizer according to a second embodiment.

An embodiment suitable for the case where the temperature must be set up higher in order to vaporize the liquid material with lower vapor pressure and being more difficult to vaporize (hereinbelow, referred to as "vaporization-resistant liquid material") as compared with the liquid material (LM) used in the first embodiment is described (FIG. 6). A vaporizer (10b1) for the vaporization-resistant liquid material generally includes the liquid material supply portion (24) and the vaporizing portion (26), as with the vaporizer (10a) according to the first embodiment, and its configuration as an apparatus is also substantially the same. Then, only differences with the first embodiment are described as follows.

In the vaporizer (10b1) for the vaporization-resistant liquid material, the liquid material supply portion (24) and the vaporizing portion (26) are isolated from each other, and a connecting tube for heat isolation (94) is arranged therebetween.

The connecting tube for heat isolation (94) is a pipe to extend the liquid material guiding orifice (40) and the liquid material supply orifice (61) substantially by a distance that the liquid material supply portion (24) and the vaporizing portion (26) are isolated from each other. The upper end of the connecting tube for heat isolation (94) is connected to the bottom end of the liquid material guiding orifice (40) while the bottom end thereof being connected to the upper end of the liquid material supply orifice (61), thereby cooperating with the liquid material guiding orifice (40) and the liquid material supply orifice (61) to constitute a passage (96) for guiding the liquid material (LM) from the liquid material supply portion (24) into the vaporizing portion (26).

As described above, isolating the liquid material supply portion (24) and the vaporizing portion (26) from each other causes the heat from the vaporizing portion (26), which reaches a high temperature, to be less transmissible to the liquid material supply portion (24). Thereby, the problem in regard to polymerization or decomposition of thermally unstable compounds due to the liquid material supply portion (24) being undesirably heated to a high temperature can be avoided.

By increasing the distance between the liquid material supply portion (24) and the vaporizing chamber (60) by providing the connecting tube for heat isolation (94), time is also increased taken for the amount of the liquid material (LM) regulated by the diaphragm (44) to be fed into the vaporizing chamber (60). The increase of the time may degrade the responsivity of the liquid material (LM) to the flow control. In order to avoid this problem, the vaporizer (10b1) includes a carrier gas feeding passage (98) to feed a small amount of the carrier gas (CG) into the valve chest (36) of the liquid material supply portion (24).

One end of the carrier gas feeding passage (98) is connected to the bottom of the valve chest (36) while the other end connected to the carrier gas supply tube (22c). By feeding the carrier gas (CG) into the valve chest (36), the volume of fluid passing through the passage (96) can be increased without changing the amount of the liquid material (LM), so that an internal flow rate can be increased. By increasing the internal flow rate, the time taken for the amount of the liquid material (LM) regulated by the diaphragm (44) to be fed into the vaporizing chamber (60) can be reduced, so that the responsivity of the liquid material (LM) to the flow control, which has been degraded due to the connecting tube for heat isolation (94) being provided, can be improved.

Figure 7:
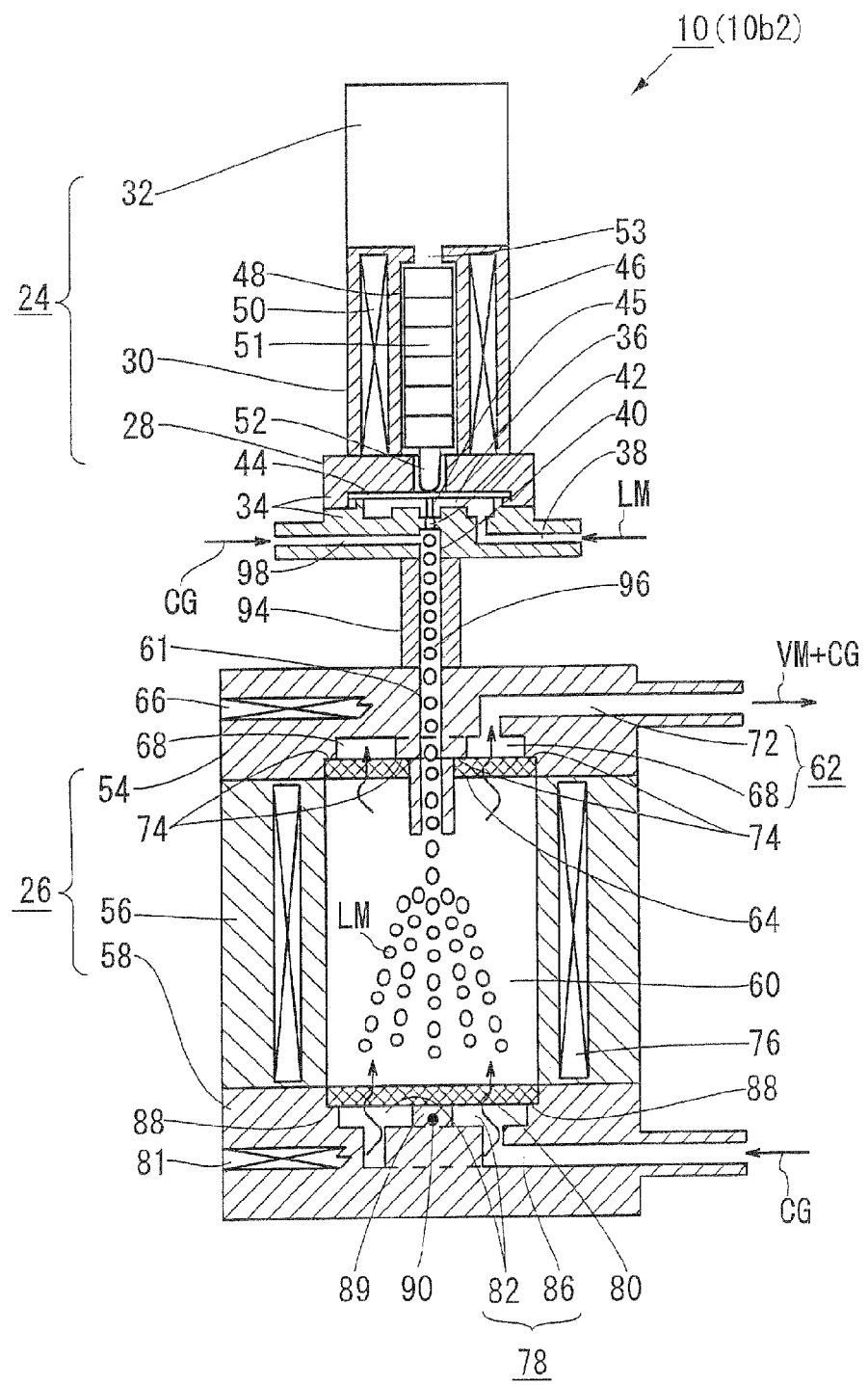
FIG. 7 shows a sectional view of a modification of the vaporizer according to the second embodiment.

One end of the carrier gas feeding passage (98) described above may be connected not to the bottom of the valve chest (36) but to a side surface of the liquid material guiding orifice (40), as in a vaporizer (10b2) shown in FIG. 7. Thereby, the vaporizer (10b2) is characterized by the internal flow rate of the passage (96) being responsive quickly to the change in the amount of the carrier gas (CG) to flow therein, because the carrier gas feeding passage (98) is directly connected to the liquid material guiding orifice (40) in the vaporizer (10b2). It is different from the case where the carrier gas (CG) flows through the valve chest (36) and then into the liquid material guiding orifice (40) as in the vaporizer (10b1).

Third Embodiment

A vaporizer (10c) according to this embodiment includes a preheating filter (102) added to the lower block (58) of the vaporizer (10c) according to the first embodiment.

Figure 8:
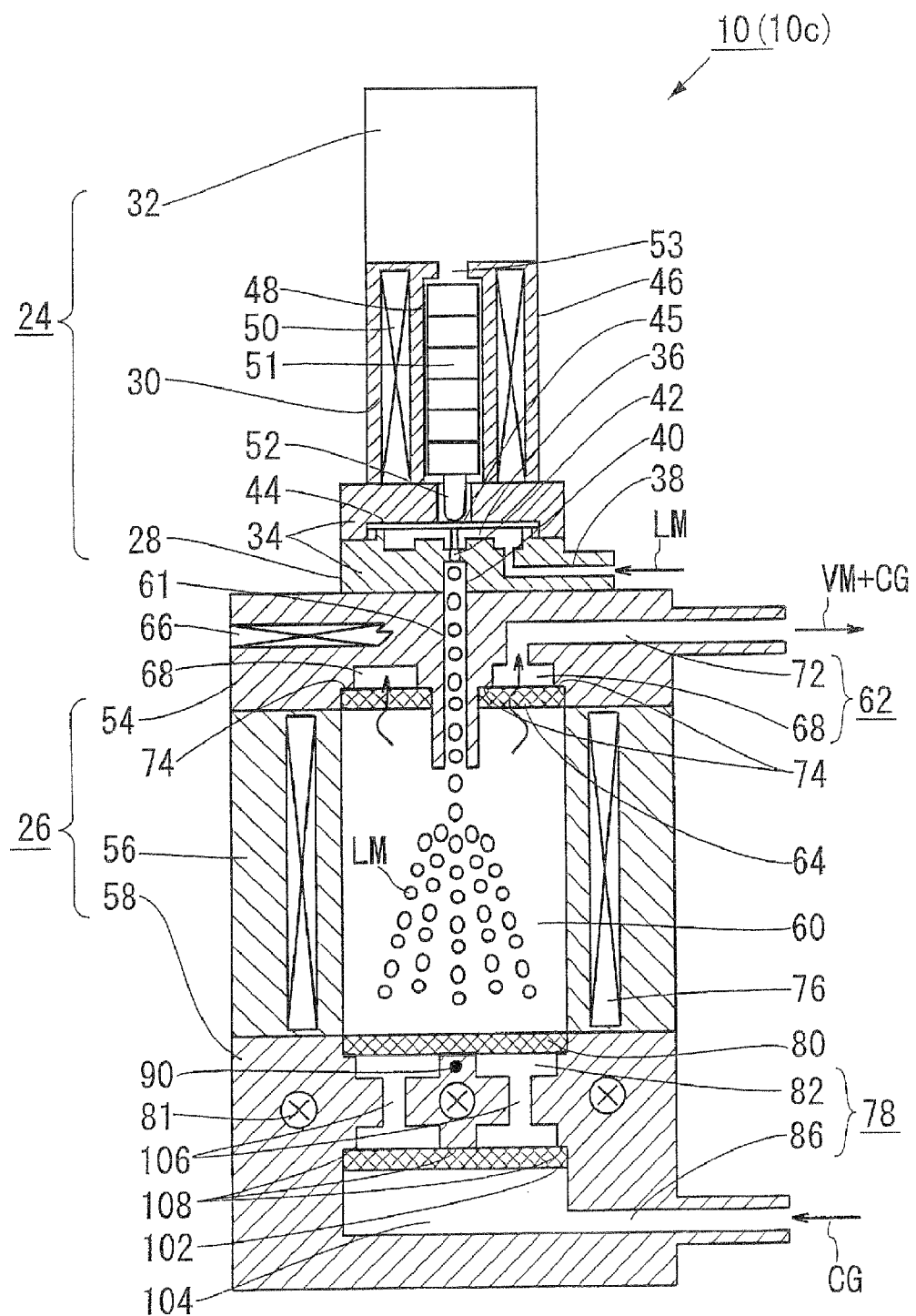
FIG. 8 shows a sectional view of the vaporizer according to a third embodiment.

As shown in FIG. 8, there is provided another space (104) between the recess (82) and the passage (86) in the carrier gas guiding passage (78) of the vaporizer (10c). The recess (82) and the space (104) are connected to each other via an orifice (106). And the passage (86) is connected to the space (104). Consequently, the carrier gas (CG), guided into the passage (86), is guided into the recess (82) via the space (104) and then fed to the vaporizing chamber (60) through the primary filter (80).

A step is provided on the side of the space (104). And the upper end portion of the space (104) is formed wider than the lower section of the space (104). This step forms a joint portion (108) where an inner surface of the space (104) in on a surface of the preheating filter (102) when the preheating filter (102) is fitted in the upper end portion of the space (104). The central portion of the space (104) is also provided with the joint portion (108) projecting downward for being on the preheating filter (102).

The preheating filter (102) is a disk-shaped plate, and transmits the heat from the lower block heater (81) to the carrier gas (CG), which is fitted in the upper portion of the space (104). The preheating filter (102), as with the primary filter (80) or the secondary filter (64), can be used the metal filters or sintered filters, as well as those made of the metal alloy, the metal fibers, the woven metallic wire fabric, or the metal mesh, as appropriate, as long as the material allows the carrier gas (CG) to pass therethrough. In addition, The filters with the apertures suitable for the use conditions can be used.

Although the carrier gas (CG) is generally at room temperature when guided into the vaporizer (10c), it may be at low temperature depending on the configuration of the vaporized liquid material supplying apparatus (12) or the type of the carrier gas (CG). As described above, the present invention is characterized in that it can offer sufficient vaporization performance at low temperature, owing to the liquid material (LM) reached to the primary filter (80) being vaporized by the heat transmitted from the primary filter (80) while further finely atomized by being subjected to the bubbling effect by the carrier gas (CG). However, when the temperature of the carrier gas (CG) is low, the performance of vaporizing the liquid material (LM) will be reduced. Because the heat which should be used to vaporize the liquid material (LM) will be utilized for heating the carrier gas (CC). The vaporizer (10*c*) according to this embodiment is intended to solve this problem, which enables the primary filter (80) to offer a given vaporization performance by heating the carrier gas (CG) preliminarily at low temperature to a desired temperature using the preheating filter (102).

Fourth Embodiment

Figure 9:
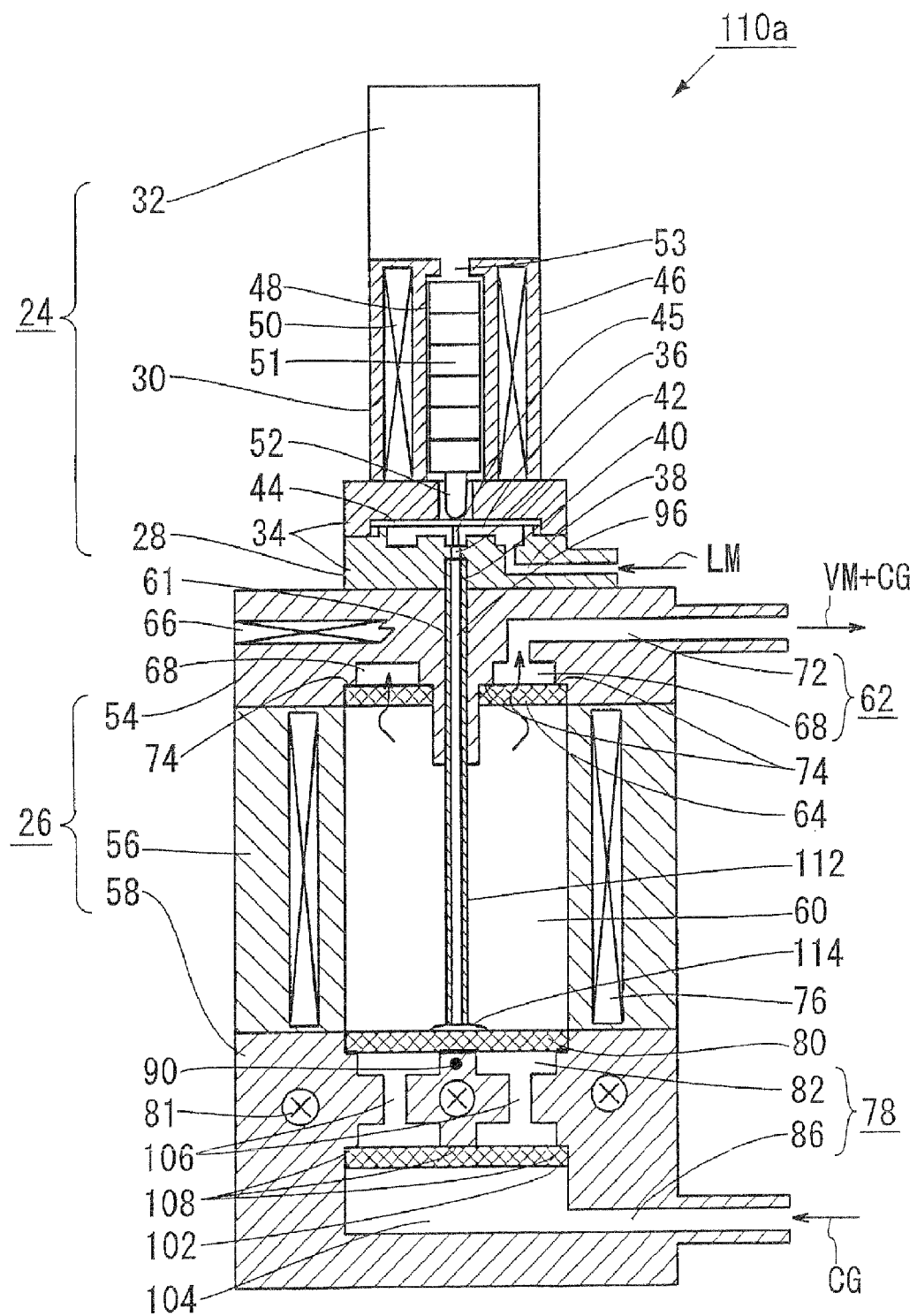
FIG. 9 shows a sectional view of the vaporizer according to a fourth embodiment.

A vaporizer (110*a*) according to this embodiment includes a capillary (112) in the liquid material supply orifice (61), as shown in FIG. 9.

The capillary (112) is a pipe having an inner diameter of 0.2 to 0.5 mm, mounted by being inserted into the liquid material supply orifice (61) in a state where the upper end is connected to the material guiding port (42) while the bottom end being placed near the top surface of the primary filter (80) with a gap of 0.1 to 1.0 mm left therebetween.

While the liquid material (LM) dropped from the liquid material supply orifice (61) falls the interior of the vaporizing chamber (60) to reach to the top surface of the primary filter (80) and forms the liquid film, it is necessary that the liquid film having a constant thickness is formed all the time for the vaporizer (110*a*) to offer the stable vaporization performance. However, since the flow of the mixed gas (VM+CG) within the vaporizing chamber (60) is variant due to a variation in the amount of the liquid material (LM) to be dropped or the flow rate of the carrier gas (CG), it is difficult to maintain the thickness of the liquid film constant. Thus, the capillary (112) is mounted to provide the vaporizer (110*a*) which is unlikely affected by the variation in the flow of the mixed gas (VM+CG) by continuously flowing the liquid material (LM) to the surface of the primary filter (80). Thereby, the supplied liquid material (LM) passes through the inside of the capillary (112) (i.e., the portion (96)) and is fed to the vicinity of the surface of the primary filter (80), so that it is not affected by convection or turbulence of flowing air generated within the vaporizing chamber (60). Accordingly, since the variation in a thickness of a liquid film (114) formed on the surface of the primary filter (80) can be reduced, the vaporizer (110*a*) can perform the stable vaporization.

In the vaporizer (110*a*) according to this embodiment, the liquid material supply portion (24) and the vaporizing portion (26) may be isolated from each other to provide the connecting tube for heat isolation (94) therebetween, as described in the second embodiment. Moreover, the carrier gas feeding passage (98) for feeding a small portion of the carrier gas (CG) into the passage (96) may be provided in the liquid material supply portion (24).

Figure 10:
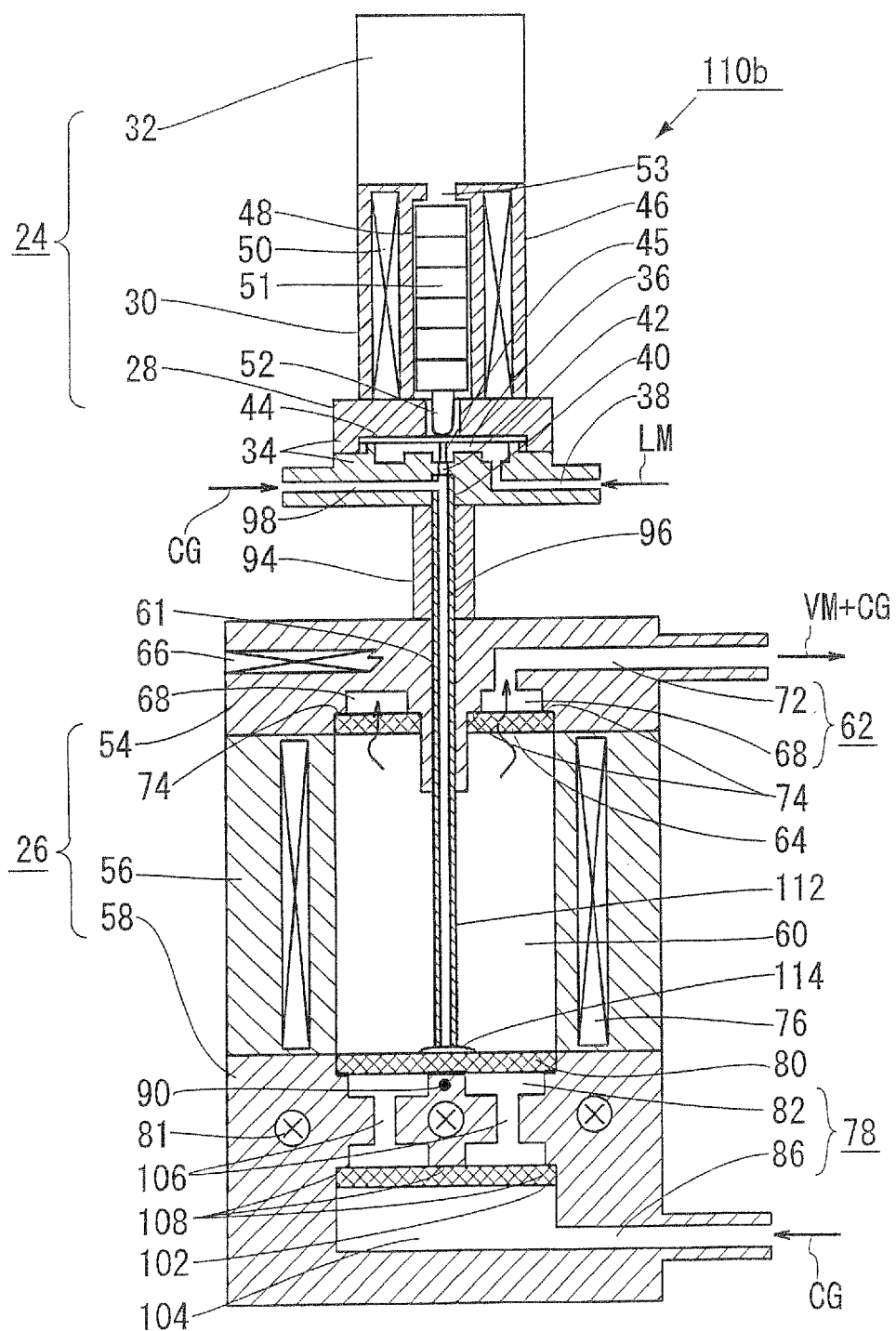
FIG. 10 shows a sectional view of a modification of the vaporizer according to the fourth embodiment.

FIG. 10 shows such a vaporizer (110*b*). Thereby, it can avoid the problem in regard to polymerization or decomposition of the thermally unstable compounds due to the liquid material supply portion (24) being undesirably heated to a high temperature, and can improve the responsivity of the liquid material (LM) to the flow control, which has been degraded due to the connecting tube for heat isolation (94) being provided.

I claim:

1. A vaporizer comprising:
a vaporizing chamber heated by heaters;
a primary filter positioned in a bottom end portion of the vaporizing chamber and heated by any of the heaters;
a liquid material supply portion arranged to supply a flow-controlled liquid material from an upper portion of the vaporizing chamber through a capillary to the vicinity of a surface of the primary filter;
a carrier gas guiding passage for guiding a carrier gas into an underside of the primary filter;
a material delivering passage for discharging a mixed gas including the carrier gas and a vaporized liquid material from the vaporizing chamber;
a connecting tube for heat isolation provided between the liquid material supply portion and the vaporizing chamber;
a carrier gas feeding passage for feeding a small portion of the carrier gas into the liquid material supply portion; and
wherein the carrier gas guiding passage has a recess in which the primary filter is positioned, edges of the primary filter contacting walls of the vaporizing chamber, a projection in a central portion of the recess, the projection connecting a central portion of the primary filter and a bottom wall of the vaporizing chamber, and a passage through which the carrier gas is guided to the underside of the primary filter.

* * * * *